United States Patent
Tanabe et al.

(10) Patent No.: US 6,815,151 B2
(45) Date of Patent: *Nov. 9, 2004

(54) RINSING SOLUTION FOR LITHOGRAPHY AND METHOD FOR PROCESSING SUBSTRATE WITH THE USE OF THE SAME

(75) Inventors: Masahito Tanabe, Kanagawa (JP); Kazumasa Wakiya, Kanagawa (JP); Masakazu Kobayashi, Kanagawa (JP); Toshimasa Nakayama, Kanagawa (JP)

(73) Assignee: Tokyo Ohika Kogyo Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 114 days.

This patent is subject to a terminal disclaimer.

(21) Appl. No.: 09/877,124

(22) Filed: Jun. 11, 2001

(65) Prior Publication Data

US 2001/0038976 A1 Nov. 8, 2001

Related U.S. Application Data

(62) Division of application No. 09/148,996, filed on Sep. 8, 1998, now abandoned.

(30) Foreign Application Priority Data

Sep. 5, 1997 (JP) .............................................. 9-256228

(51) Int. Cl.[7] ................................................. G03F 7/42
(52) U.S. Cl. ....................... 430/329; 430/322; 430/325; 430/331; 134/1.3; 510/176
(58) Field of Search ................................. 430/322, 325, 430/329, 331; 134/1.3; 510/176

(56) References Cited

U.S. PATENT DOCUMENTS

| | | | |
|---|---|---|---|
| 4,090,936 A | * 5/1978 | Barton | 430/280.1 |
| 4,983,490 A | 1/1991 | Durham | 430/169 |
| 5,652,938 A | 7/1997 | Uraguchi | 396/611 |
| 5,736,495 A | 4/1998 | Bolkan | 510/202 |
| 5,964,951 A | 10/1999 | Yamamoto | 134/1.2 |
| 5,968,848 A | 10/1999 | Tanabe | 438/745 |
| 6,033,993 A | * 3/2000 | Love, Jr. et al. | 438/745 |
| 6,068,000 A | 5/2000 | Tanabe | 134/1.3 |
| 6,127,097 A | 10/2000 | Bantu | 430/315 |
| 6,159,646 A | 12/2000 | Jeon | 430/30 |
| 2001/0038976 A1 | * 11/2001 | Tanabe et al. | 430/325 |

FOREIGN PATENT DOCUMENTS

| | | | |
|---|---|---|---|
| JP | 56-155942 | | 12/1981 |
| JP | 6-27684 | * | 2/1994 |
| JP | 8-104895 | | 4/1996 |

* cited by examiner

*Primary Examiner*—Mark F. Huff
*Assistant Examiner*—Nicole Barreca
(74) *Attorney, Agent, or Firm*—Sughrue Mion, PLLC

(57) ABSTRACT

The present invention provides a rinsing solution for lithography with which finely processed parts of a resist pattern can be well rinsed without corroding a metallic film made of Al, Al—Si, Al—Si—Cu, etc. and which is economically advantageous and has a high safety; and a method for processing a substrate with the use of the same. The rinsing solution contains at least one selected from the group consisting of ethylene glycol monomethyl ether, ethylene glycol monoethyl ether, propylene glycol monomethyl ether, propylene glycol monoethyl ether and ethyl lactate.

6 Claims, No Drawings

RINSING SOLUTION FOR LITHOGRAPHY AND METHOD FOR PROCESSING SUBSTRATE WITH THE USE OF THE SAME

This is a Divisional of application Ser. No. 09/148,996 filed Sep. 8, 1998 now abandoned, the disclosure of which is incorporated herein by reference.

FIELD OF THE INVENTION

The present invention relates to a rinsing solution for lithography, more specifically, a rinsing solution for rinsing a substrate which has been treated with a remover solution in manufacturing electronic parts such as a semiconductor device and a liquid crystal display device, and a method for processing a substrate with the rinsing solution.

BACKGROUND OF THE INVENTION

The conventional process for manufacturing semiconductor devices and liquid crystal display devices comprises forming a resist pattern on a conductive metallic film made of aluminum, copper, aluminum alloy, etc. or an insulating film made of $SiO_2$, etc. on a substrate, selectively etching the conductive metallic film or insulating film utilizing the formed pattern as a mask to thereby form fine circuits, and then removing the unnecessary resist pattern layer with the use of a remover solution.

Known examples of the remover solution for removing the resist include an organic sulfonic acid-based remover solution containing an alkylbenzenesulfonic acid as the main component, an organic amine-based remover solution containing an organic amine such as monoethanolamine as the main component, and a fluoric acid-based remover solution containing hydrofluoric acid as the main component. In the conventional method, a resist pattern layer is removed with such a remover solution and washing is then effected with purified water. However, the washing with purified water can not completely wash away the remover solution in a short time. Furthermore, if the washing time is prolonged, the corrosion of the conductive metallic film or insulating film is liable to occur. For this reason, the remover solution is removed with an organic solvent (i.e., rinsing treatment) prior to the washing with purified water. As the organic solvent useful for the rinsing treatment, use has been made of methanol, ethanol, isopropyl alcohol, acetone, ethylene glycol, etc. However, the remover solution cannot be sufficiently washed away, and it is difficult to remove the remover solution, particularly, in finely processed parts. Since fine processing techniques have recently made a rapid progress in the field of manufacturing semiconductors, it has been urgently required to develop a rinsing solution by which finely processed parts can be sufficiently washed without causing any corrosion of a conductive metallic film or an insulating film. The conventional rinsing solutions suffer from the following practical problem. That is to say, when the interval period between rinsing and the subsequent treatment is prolonged, stains due to insufficient rinsing (in other words, stains attributable to rinsing) would be frequently formed on the substrate surface. During processing the substrate, therefore; the margin (the range which does not cause any problems) of the transportation time is narrow and thus should be controlled in detail. In addition to the necessity for these functional improvements, attention should be paid to the cost and safety of various chemicals (a developer solution, a remover solution, a rinsing solution, etc.) which are used in the lithographic processing in manufacturing semiconductors.

SUMMARY OF THE INVENTION

Under these circumstances, the present inventors have conducted extensive studies and, as a result, found out that a highly useful in practice, less expensive and highly safe rinsing solution, by which finely processed parts can be sufficiently washed without causing any corrosion of a conductive metallic film or insulating film and which has a broad margin of the transportation time during substrate processing and thereby causes no stain on the substrate due to insufficient rinsing, can be obtained by using a specific compound in the rinsing solution, thus completing the present invention.

Accordingly, an object of the present invention is to provide a rinsing solution for lithography, by which finely processed parts can be easily washed without causing any corrosion of conductive metallic films or insulating films and which causes no stain on the substrate due to insufficient rinsing.

Another object of the present invention is to provide a rinsing solution for lithography which is economically advantageous and highly safe.

Other object of the present invention is to provide a method for processing a substrate by the use of the rinsing solution for lithography.

DETAILED DESCRIPTION OF THE INVENTION

The above-mentioned objects can be achieved by a rinsing solution for lithography for rinsing a substrate having been treated with a remover solution, wherein said rinsing solution contains at least one selected from the group consisting of ethylene glycol monomethyl ether, ethylene glycol monoethyl ether, propylene glycol monomethyl ether, propylene glycol monoethyl ether and ethyl lactate; and a method for processing a substrate utilizing the rinsing solution for lithography.

The rinsing solution for lithography of the present invention is one for rinsing a substrate having been treated with a remover solution for manufacturing a semiconductor device or liquid crystal display device, which contains at least one selected from the group consisting of ethylene glycol monomethyl ether, ethylene glycol monoethyl ether, propylene glycol monomethyl ether, propylene glycol monoethyl ether and ethyl lactate, generally in an amount of 35% by weight or more. Among these components, propylene glycol monomethyl ether is particularly preferable from the viewpoints of the practical usability involving the rinsing effect and cost.

If needed, the rinsing solution may further contain other water soluble organic solvents. Examples of the water soluble organic solvents include monohydric alcohols such as methyl alcohol, ethyl alcohol and isopropyl alcohol; ketones such as acetone; sulfoxides such as dimethyl sulfoxide; sulfones such as dimethyl sulfone, diethyl sulfone, bis(2-hydroxyethyl) sulfone and tetramethylene sulfone; amides such as N,N-dimethylformamide, N-methylformamide, N,N-dimethylacetamide, N-methylacetamide and N,N-diethylacetamide; lactams such as N-methyl-2-pyrrolidone, N-ethyl-2-pyrrolidone, N-propyl-2-pyrrolidone, N-hydroxymethyl-2-pyrrolidone and N-hydroxyethyl-2-pyrrolidone; imidazolidinones such as 1,3-dimethyl-2-imidazolidinone, 1,3-diethyl-2-imidazolidinone and 1,3-diisopropyl-2-imidazolidinone; lactones such as γ-butyrolactone and δ-valerolactone; and polyhydric alcohols and derivatives thereof such as ethylene glycol, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether and propylene glycol. Among all, it is preferable to use methyl alcohol, ethyl alcohol, isopropyl alcohol, ethylene glycol or propylene glycol.

The other water soluble organic solvent as described above can be incorporated in an amount of from 0 to 50% by weight based on the rinsing solution. It is not preferable that the content thereof exceeds 50% by weight, since the finely processed parts of the resist pattern cannot be washed well.

In addition to the above-mentioned components, the rinsing solution of the present invention may further contain a corrosion inhibitor. Examples of the corrosion inhibitor include an aromatic hydroxy compound, an acetylene alcohol, a carboxyl group-containing organic compound and an anhydride thereof, a triazole compound and a saccharide.

Examples of the aromatic hydroxy compound include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydrocybenzoic acid, 3,4-dihydroxybenzoic acid and 3,5-dihydroxybenzoic acid, with pyrocatechol being preferred.

Examples of the acetylene alcohol include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyne-3,6-diol, 2,4,7,9-tetramethyl-5-decyne-4,7-diol and 2,5-dimethyl-3-hexyne-2,5-diol, with 2-butyne-1,4-diol being preferred.

Examples of the carboxyl group-containing organic compound and anhydride thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride and salicylic acid, with formic acid, phthalic acid, benzoic acid, phthalic anhydride and salicyclic acid being preferred and phthalic acid, phthalic anhydride and salicylic acid being more preferred.

Examples of the triazole compound include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole, with benzotriazole being preferred.

Examples of the saccharide include D-sorbitol, arabitol, mannitol, sucrose and starch, with D-sorbitol being preferred.

The corrosion inhibitor may be incorporated singly or as a mixture of two or more thereof. The content thereof ranges generally from 0.5 to 15% by weight, preferably from 1 to 5% by weight. The use of such a corrosion inhibitor is preferred, since the corrosion of metallic film can be further inhibited.

The rinsing solution of the present invention is used to wash away a remover solution remaining on a substrate after removing a resist pattern from the substrate with the use of the remover solution. Any known remover solutions can be used without restriction, but, it is preferable to use an organic amine-based remover solution containing an organic amine compound and the rinsing solution of the present invention achieves an excellent washing effect particularly on the organic amine-based remover solutions. Examples of the organic amine compound include hydroxylamines, primary, secondary and tertiary aliphatic amines, alicyclic amines, aromatic amines and heterocyclic amines. More particularly, use may be made of hydroxylamine, N,N-diethylhydroxylamine, monoethanolamine, ethylenediamine, 2-(2-aminoethylamino)ethanol, diethanolamine, dipropylamine, 2-ethylaminoethanol, dimethylaminoethanol, etyldiethanolamine, cyclohexylamine, dicyclohexylamine, benzylamine, dibenzylamine, N-methylbenzylamine, pyrrole, pyrrolidine, pyrrolidone, pyridine, morpholine, pyrazine, piperidine, N-hydroxyethylpiperidine, oxazole and thiazole.

The method for processing a substrate of the present invention comprises forming a desired resist pattern on the substrate; etching the substrate; treating the resist pattern with a remover solution; and treating the same with the above-mentioned rinsing solution followed by washing with purified water. The resist pattern can be obtained by a patterning method commonly employed in the art, for example, forming a resist layer on a substrate by using an application method such as rotational application, roll coating or bar coating of a positive- or negative-type resist composition onto a substrate (silicone wafer, glass substrate, etc.) to be used in manufacturing semiconductor devices or liquid crystal display devices, and then forming a latent image by irradiation or drawing, via a mask pattern, with radiations (UV light, fat-ultraviolet light including eximer laser, electron beams, X-ray, etc.), followed by the development with an aqueous alkali solution. The removing treatment can be performed by, for example, immersing the substrate on which the resist pattern has been formed in a remover solution at room temperature for 1 to 20 minutes. The rinsing treatment can be carried out by, for example, the immersion method at room temperature for 3 to 20 minutes.

To further illustrate the present invention in greater detail, and not by way of limitation, the following Examples will be given.

EXAMPLES 1 TO 9 AND COMPARATIVE EXAMPLES 1 TO 5

A positive-type photoresist (THMR-ip3300, manufactured by Tokyo Ohka Kogyo Co., Ltd.) composed of a naphthoquinone diazide compound and a novolak resin was applied with a spinner on a silicone wafer (6 in) metallized with an Al—Si—Cu film having a thickness of about 1.0 $\mu$m. After drying at 90° C. for 90 seconds, a resist film of 1.05 $\mu$m in thickness was formed. Next, this resist film was exposed to light via a mask pattern NSR-2005i10D (manufactured by Nikon Corporation) and then developed with a 2.38% by weight aqueous solution of tetramethylammonium hydroxide to thereby form a resist pattern, which was then post-basked at 120° C. for 90 seconds.

The above-mentioned silicone wafer was etched by using an etching apparatus TSS-6000 (manufactured by Tokyo Ohka Kogyo Co., Ltd.) with the use of a gas mixture of chlorine with boron trichloride as an etchant under a pressure of 5 Torr at a stage temperature of 20° C. for 168 seconds. Then it was subjected to an after-corrosion treatment with the use of a gas mixture of oxygen with trifluoromethane under a pressure of 20 Torr at a stage temperature of 20° C. for 30 seconds. After the completion of this treatment, it was further ashed by using an ashing apparatus TCA-2400 (manufactured by Tokyo Ohka Kogyo Co., Ltd.) with the use of oxygen gas under a pressure of 0.3 Torr at a stage temperature of 60° C. for 150 seconds.

The silicone wafer thus treated was then immersed successively in a remover solution (Stripper 106, manufactured by Tokyo Ohka Kogyo Co., Ltd.) heated to 90° C. for 10 minutes, in a rinsing solution (25° C.) of each composition as specified in Table for 3 minutes and then in purified water for 3 minutes. After washing with running purified water and drying, the surface of the silicone wafer was observed to evaluate the degree of removing the removal solution and resist, and corrosion state. Furthermore, with respect to each rinsing solution, the generation of stain depending on the interval period between the immersion in the rinsing solution and the subsequent treatment, i.e., the immersion in purified water, was evaluated by observing the surfaces of the silicone wafers treated varying the interval period (5, 10, 15 and 30 seconds).

The criteria of each evaluation are as follow.

Surface Observation
- A: The remover solution and the resist were completely removed.
- B: Clouding was observed and the remaining resist was confirmed.

Corrosion
- A: No corrosion was confirmed by observing the Al surface with the exposed contact holes (1.0 μm or less) under an electron microscope.
- B: Corrosion was confirmed by observing the Al surface with the exposed contact holes (1.0 μm or less) under an electron microscope.

Remaining Stain
- A: No remaining stain was confirmed on the surface of the silicone wafer.
- B: Remaining stain was confirmed on the surface of the silicone wafer.

The obtained results are shown in Table below.

The rinsing solution for lithography of the present invention is one which has a high safety and by which finely processed parts of a resist pattern can be sufficiently washed without causing any corrosion of metallic films made of Al, Al—Si, Al—Si—Cu, etc. which are easily corroded. Moreover, it shows a broad margin of the transportation time during substrate processing and, therefore, makes any detailed control on the transportation time until the water-washing step unnecessary, which makes the rinsing solution highly useful in practice. Use of this rinsing solution for lithography makes it possible to manufacture semiconductor devices and liquid crystal display devices which are excellent in qualities and yet less expensive.

While the invention has been described in detail and with reference to specific examples thereof, it will be apparent to one skilled in the art that various changes and modifications can be made therein without departing from the spirit and scope thereof.

What is claimed is:

1. A method for processing a substrate, which comprises:
   forming a desired resist pattern on the substrate;
   etching the substrate;
   removing said resist pattern with a remover solution;
   and treating the substrate having been treated with the remover solution with a rinsing solution consisting essentially of at least one selected from the group consisting of ethylene glycol monomethyl ether, ethylene glycol monoethyl ether, propylene glycol monomethyl ether, propylene glycol monoethyl ether and ethyl lactate, and at least a second water soluble organic solvent selected from the group consisting of monohydric alcohols, ketones, sulfoxides, sulfones, amides, lactams, imidazolidinones, lactones and polyhydric alcohols and derivatives thereof, followed by washing with water.

TABLE

| Sample No. | Rinsing Solution (wt %) | Surface Observation | Corrosion | Remaining Stain Interval Period (sec.) | | | |
|---|---|---|---|---|---|---|---|
| | | | | 5 | 10 | 15 | 30 |
| Example 1 | PGMM (70) + IPA (30) | A | A | A | A | A | A |
| Example 2 | PGMM (60) + EG (40) | A | A | A | A | A | A |
| Example 3 | PGME (80) + IPA (20) | A | A | A | A | A | B |
| Example 4 | EL (70) + IPA (30) | A | A | A | A | A | B |
| Example 5 | EL (50) + MeOH (50) | A | A | A | A | A | B |
| Example 6 | EL (80) + EG (20) | A | A | A | A | A | B |
| Example 7 | EL (70) + PG (30) | A | A | A | A | A | B |
| Example 8 | PGMM (100) | A | A | A | A | A | A |
| Example 9 | EL (100) | A | A | A | A | A | B |
| Comparative Example 1 | water (100) | A | B | A | A | A | A |
| Comparative Example 2 | glycerol (100) | B | B | A | A | B | B |
| Comparative Example 3 | Solvesso (100) | B | A | A | A | B | B |
| Comparative Example 4 | IPA (100) | A | B | A | B | B | B |
| Comparative Example 5 | acetone (100) | A | B | A | B | B | B |

Note)
PGME: propylene glycol monoethyl ether
PGMM: propylene glycol monomethyl ether
IPA: isopropyl alcohol
EG: ethylene glycol
EL: ethyl lactate
MeOH: methyl alcohol
PG: propylene glycol
Solvesso: aromatic hydrocarbon solvent (manufactured by Exxon Chemical Japan Ltd.)

2. The method of claim 1, wherein the remover solution is an organic amine-based remover solution containing an organic amine compound.

3. The method of claim 2, wherein the organic amine compound is selected from the group consisting of hydroxylamines, primary, secondary and tertiary aliphatic amines, alicyclic amines, aromatic amines and heterocyclic amines.

4. The method for processing a substrate of claim 1, wherein the rinsing solution further contains at least a second water soluble organic solvent in an amount of from 20% to 50% by weight based on the rinsing solution.

5. The method for processing a substrate of claim 1, wherein the rinsing solution further contains a corrosion inhibitor in an amount of from 0.5 to 15% by weight based on the rinsing solution.

6. The method for processing a substrate of claim 5, wherein the corrosion inhibitor is at least one selected from the group consisting of an aromatic hydroxy compound, an acetylene alcohol, a carboxyl group-containing organic compound and an anhydride thereof, a triazole compound and a saccharide.

* * * * *